United States Patent
Jayaraman et al.

(10) Patent No.: US 9,658,791 B2
(45) Date of Patent: May 23, 2017

(54) MANAGING TEMPERATURE OF SOLID STATE DISK DEVICES

(71) Applicant: International Business Machines Corporation, Armonk, NY (US)

(72) Inventors: Prasanna Jayaraman, Bangalore (IN); Trinadhachari Kosuru, Bangalore (IN); M. Dean Sciacca, Poughkeepsie, NY (US); Janani Swaminathan, Chennai (IN); Gary A. Tressler, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 14/826,501

(22) Filed: Aug. 14, 2015

(65) Prior Publication Data

US 2017/0046088 A1    Feb. 16, 2017

(51) Int. Cl.
*G06F 12/00*  (2006.01)
*G06F 3/06*   (2006.01)
*G06F 12/02*  (2006.01)

(52) U.S. Cl.
CPC ........ *G06F 3/0629* (2013.01); *G06F 3/0604* (2013.01); *G06F 3/0614* (2013.01); *G06F 3/0616* (2013.01); *G06F 3/0673* (2013.01); *G06F 12/0238* (2013.01); *G06F 12/0246* (2013.01)

(58) Field of Classification Search
CPC .... G06F 3/0629; G06F 3/0604; G06F 3/0673; G06F 3/0614; G06F 3/0616; G06F 12/0238; G06F 12/0246
See application file for complete search history.

(56) References Cited

U.S. PATENT DOCUMENTS

| | | | |
|---|---|---|---|
| 8,694,719 B2 | 4/2014 | Lassa et al. | |
| 8,954,689 B2 | 2/2015 | Seekins et al. | |
| 9,092,146 B2 | 7/2015 | Jayaraman et al. | |
| 2004/0153902 A1* | 8/2004 | Machado | G06F 11/1068 714/710 |
| 2010/0023678 A1* | 1/2010 | Nakanishi | G06F 1/206 711/103 |

(Continued)

OTHER PUBLICATIONS

Jayaraman, et al., "Transfer Size Monitor, Determination and Optimization Engine for Storage Devices", U.S. Appl. No. 14/301,185, filed Jun. 10, 2014.

(Continued)

*Primary Examiner* — Shawn X Gu
(74) *Attorney, Agent, or Firm* — Daniel C. Housley

(57) ABSTRACT

A solid state disk (SSD) device has a set of data transfer parameters which regulate I/O operations of the SSD device. The temperature of the SSD device is monitored using temperature readings from a temperature sensor. The temperature of the SSD device satisfies a temperature threshold. A data transfer modification is determined. The data transfer modification is capable of modifying one or more data transfer parameters of the set of data transfer parameters. The set of data transfer parameters is modified using the data transfer modification in response to the temperature of the SSD satisfying the temperature threshold. One or more I/O operations are completed with the SSD device using the modified set of data transfer parameters.

10 Claims, 5 Drawing Sheets

(56) References Cited

U.S. PATENT DOCUMENTS

| | | |
|---|---|---|
| 2012/0239860 A1 | 9/2012 | Atkisson et al. |
| 2013/0080679 A1 | 3/2013 | Bert |
| 2014/0149638 A1 | 5/2014 | Jain et al. |
| 2014/0365714 A1 | 12/2014 | Sweere et al. |
| 2015/0006785 A1 | 1/2015 | Jayaraman et al. |
| 2015/0074328 A1 | 3/2015 | Baryudin et al. |

OTHER PUBLICATIONS

Jayaraman, et al., "Transfer Size Monitor, Determination and Optimization Engine for Storage Devices", U.S. Appl. No. 14/520,402, filed Oct. 22, 2014.

Unknown, "SSD Performance XceedIOPS2, XceedStor 500S, Xcel-200", Application Note AN007, Smart Storage Systems, May 2012. 11 pages.

Jayaraman, et al., "Managing Temperature of Solid State Disk Devices", U.S. Appl. No. 14/870,125, filed Sep. 30, 2015.

List of IBM Patents or Patent Applications Treated as Related, Sep. 29, 2015. 2 pages.

\* cited by examiner

| Subrun | Temp (C) | Write Amplification WA | Subrun | Temp (C) | Write Amplification WA |
|---|---|---|---|---|---|
| Rand_write_4k | 41 | 2.11 | Seq_write_4k | 36 | 1.09 |
| Rand_write_8k | 42 | 2.11 | Seq_write_8k | 37 | 1.08 |
| Rand_write_16k | 43 | 2.11 | Seq_write_32k | 39 | 1.08 |
| Rand_write_32k | 40 | 2.11 | Seq_write_64k | 40 | 1.08 |
| Rand_write_64k | 43 | 2.11 | Seq_write_128k | 40 | 1.08 |
| Rand_write_128k | 41 | 2.11 | Seq_write_256k | 40 | 1.08 |
| Rand_write_64k | 41 | 2.11 | Seq_write_128k | 40 | 1.08 |
| Rand_write_32k | 42 | 2.11 | Seq_write_64k | 40 | 1.08 |
| Rand_write_16k | 42 | 2.11 | Seq_write_32k | 39 | 1.08 |
| Rand_write_8k | 41 | 2.11 | Seq_write_8k | 37 | 1.08 |
| Rand_write_4k | 42 | 2.12 | Seq_write_4k | 36 | 1.09 |

FIG. 5

MANAGING TEMPERATURE OF SOLID STATE DISK DEVICES

BACKGROUND

Solid State Disk (SSD) devices generally demonstrate advantages over Hard Disk Drives (HDD) because they are based on a semiconductor memory technology rather than on rotating mechanical media as in HDDs. SSDs generally exhibit lower latencies and faster response times. These characteristics offer higher throughput, especially for enterprise workloads such as data analytics that are Input/Output (I/O) intensive.

SUMMARY

Embodiments of the disclosure provide a method, system, and computer program product for managing temperature of a solid state disk (SSD) device. The SSD device may have a set of data transfer parameters which regulate I/O operations of the SSD device. Aspects of the disclosure relate to monitoring the temperature of the SSD device. The SSD device may be monitored using temperature readings from a temperature sensor. The temperature of the SSD device may satisfy a temperature threshold. A data transfer modification may be determined. The data transfer modification may be capable of modifying one or more data transfer parameters of the set of data transfer parameters, such as the data packet size used during data transfer or the write method used during data transfer. The set of data transfer parameters may be modified using the data transfer modification in response to the temperature of the SSD satisfying the temperature threshold. One or more I/O operations may be completed with the SSD device using the modified set of data transfer parameters.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 5 is a depiction of example results using the method of FIG. 3 to manage temperature, according to embodiments.

Figure 1:
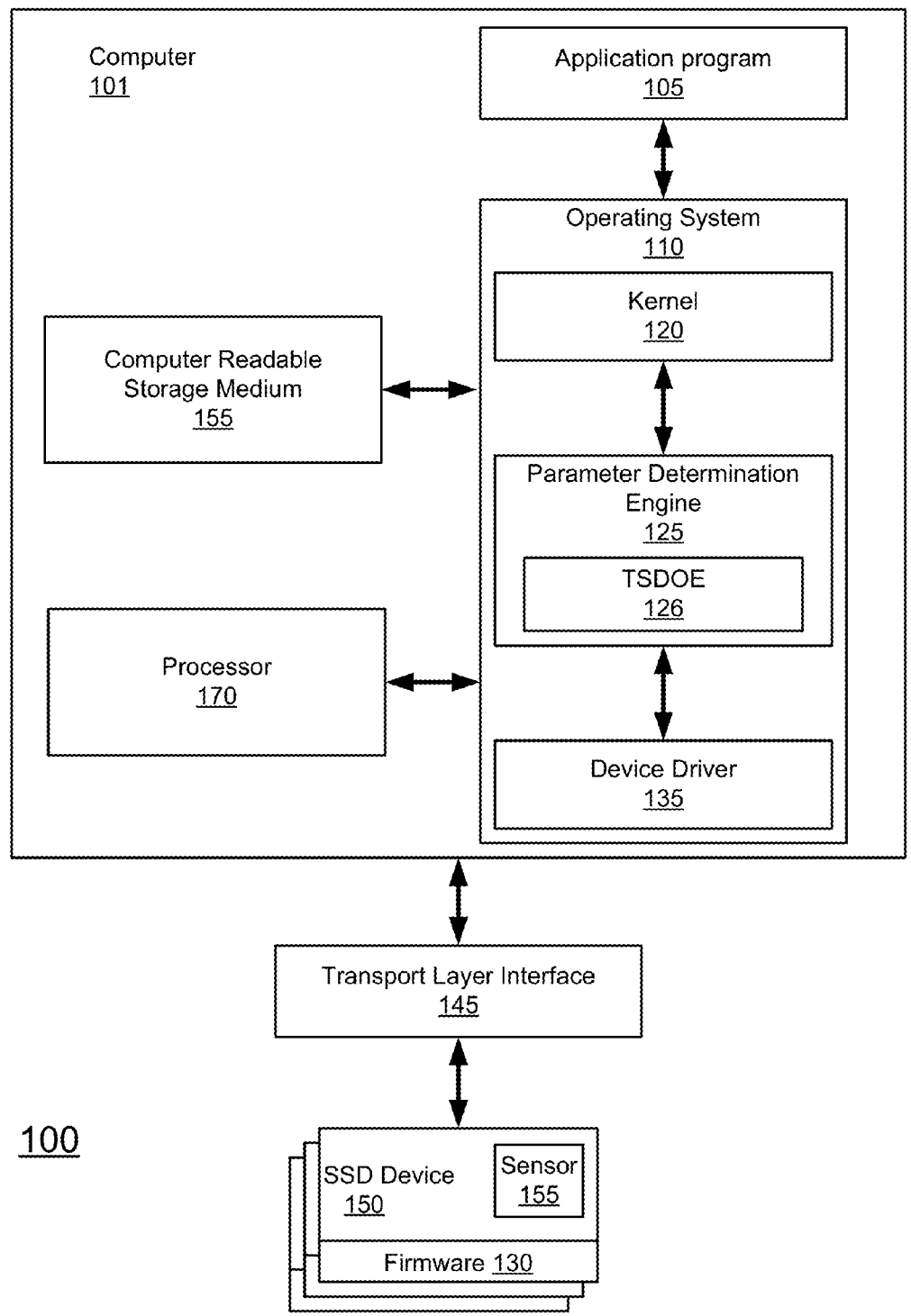
FIG. 1 is a schematic block diagram of a computing software environment, according to embodiments.

While embodiments of the disclosure are amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate to various embodiments of a system and method for managing temperature of a Solid State Disk (SSD) device. The use of an SSD device may increase the temperature of the SSD device, which may have undesired consequences. To avoid this, a controller may manage the temperature of the SSD device. Managing the temperature may include monitoring the temperature of the SSD device. As the monitored temperature of the SSD changes, the controller may modify the data transfer method between random and sequential or change the data transfer packet size. The controller may continue these modifications while and in response to the monitored temperature changes. Alternatively, if temperature stabilizes or drops, the controller may roll back some of these modifications. While the present disclosure is not necessarily limited to such applications, various aspects of the disclosure may be appreciated through a discussion of various examples using this context. Examples and example values discussed herein are provided by way of example only and are not to be construed as limiting.

Various factors may increase the temperature of an SSD, such as a higher-than-normal volume of write or erase activity to the SSD or the temperature control features within the drive enclosure of the SSD. In instances where the temperature of an SSD is not managed, the temperature may raise to a point which negatively impacts performance. Negative performance impacts may include a decrease in data retention capability of the SSD and an acceleration in charge de-trapping of the floating gate which can in turn result in increased bit error rate (BER). Increased temperatures may also decrease the life expectancy of the SSD in instances.

Aspects of the disclosure relate to modifying data transfer parameters to manage temperature. Data transfer parameters may include the size of data transfer and the method of writing data to the SSD (e.g., writing data to random cells of the SSD or to sequential cells of the SSD). By managing temperature, a controller may reduce or avoid negative performance impacts and negative life expectancy impacts of the SSD device. Managing the temperature of a SSD may begin with monitoring the temperature of the SSD. As the temperature of the SSD reaches one or more temperature thresholds, the controller may modify transfer parameters. If the temperature increases or drops to another threshold, the data transfer parameters can be further modified or reverted to previous settings. In some embodiments at a throttling threshold the data transfer of the SSD may be throttled until the temperature lowers to a predetermined level.

In embodiments, there may be numerous parameter settings which will result in the same SSD temperature. For example, an SSD may be able to accommodate writes of sizes 4 kilobytes (kB), 8 kB, 32 kB, 64 kB, 128 kB, and 256 kB. In some embodiments, the SSD device may not undergo substantial temperature variations between 32 kB, 64 kB, and 128 kB data size transfers. When the temperature does not change between a set of data transfer parameters, the SSD may select the data transfer parameter which results in the best performance of the SSD. In certain embodiments, the SSD may have access to a lookup table which details which data transfer parameters will result in the best SSD performance.

As depicted in FIG. 1, the system 100 may include one or more SSD devices 150 communicating with a computer 101 with one or more processors 170 through a Transport Layer Interface (TLI) 145 protocol (e.g., fiber channel). The one or more SSD devices 150 may include firmware 130 which acts as a control program. The computer 101 may further include an application program 105 which may be stored on the computer readable storage medium 155 and which may execute on the one or more processors 170. The one or more processors may be communicatively coupled with memory of the computer 101. Within the computer 101, an operating system 110 may include specialized instructions for the management of the hardware and software components of the computer 101 such as, for example, those of the computer environment shown as 200 in FIG. 2.

The kernel 120 component of the operating system 110 may include management of the low-level communications between the hardware and software components, also called the abstraction layer. The kernel 120 may also include other operating system 110 sub-components, such as a device table which defines the devices connected to the computer 101 and their characteristics. The operating system 110 may further consist of one or more device drivers 135 which may control a particular type of device (e.g., such as any SSD devices 150 which are attached to the computer 101). Other software programs may be installed in the computer 101 that may supplement and extend the functionality of the operating system 110. For example, a parameter determination engine 125 may analyze and manage the I/O requests between another software layer (e.g., the application program 105) and a device (e.g., a SSD device 150) to manage temperature. The parameter determination engine 125 may respond to temperature readings from a sensor 155 (e.g., temperature sensor) on the SSD device. The parameter determination engine 125 may be supplied in one of several platform-dependent formats (e.g., Linux), and may be installed using standard operating system specific procedures (e.g., red-hat package manager (RPM), the Linux software install program). The parameter determination engine 125 may include a Transfer Size Determination and Optimization Engine (TSDOE) 126 which analyzes and optimizes the I/O requests between the application program 105 and the SSD device 150 when temperature remains substantially similar across a plurality of data transfer parameter sets.

Figure 2:
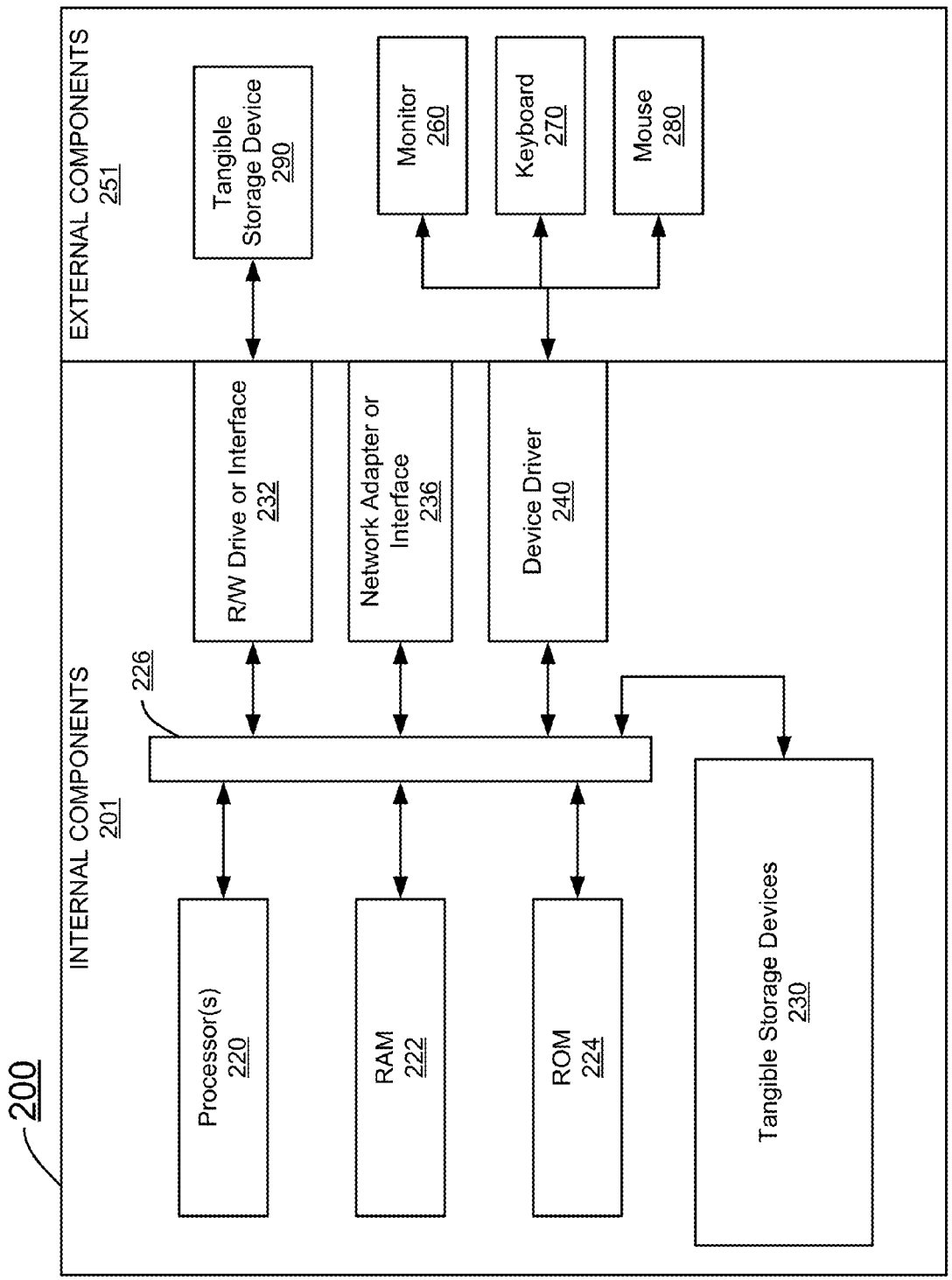
FIG. 2 is a block diagram of hardware and software for managing temperature of a solid state drive device, according to embodiments.

Referring now to FIG. 2, computing device 200 may include respective sets of internal components 201 and external components 251. In some embodiments, the computing device 200 may be the computer 101 of FIG. 1. The internal components 201 may include processors 220, computer-readable RAMs 222, computer-readable ROMs 224 on one or more buses 226. The computing device 200 may also include computer-readable tangible storage devices 230 on the one or more buses 226. The tangible storage devices 230 may store operating systems or software applications (e.g., the parameter determination engine 125 and TSDOE 126 from FIG. 1) for execution by the respective processors 220 via the respective RAMs 222 (which typically include cache memory). In some embodiments, the computer-readable tangible storage devices 230 may be magnetic disk storage devices of an internal hard drive. Alternatively, the computer-readable tangible storage devices 230 may be a semiconductor storage device such as ROM 224, EPROM, flash memory, or any other computer-readable tangible storage device that can store a computer program and digital information.

The internal components 201 may include a read/write (R/W) drive or interface 232 to read from and write to one or more computer-readable tangible storage devices 290 such as a CD-ROM, DVD, SSD, memory stick, magnetic tape, magnetic disk, optical disk, or semiconductor storage device.

Each set of internal components 201 may also include network adapters (or switch port cards) or interfaces 236 (e.g., TCP/IP adapter cards, wireless WI-FI interface cards, 3G or 4G wireless interface cards, or other wired or wireless communication links). Firmware or operating systems 228 that are associated with the computing device 200 may be downloaded to the computing device 200 from an external computer (e.g., server) via a network (e.g., the Internet, a local area network, a wide area network) over respective network adapters or interfaces 236. From the network adapters/switch port adaptors or interfaces 236, the firmware and operating system 228 associated with the computing device 200 are loaded into the respective storage device (e.g., hard drive) 230 and network adapter 236. The network may comprise copper wires, optical fibers, wireless transmission, routers, firewalls, switches, gateway computers, and/or edge servers.

External components 251 can include a computer display monitor 260, a keyboard 270, and a computer mouse 284. External components 251 can also include touch screens, virtual keyboards, touch pads, pointing devices, and other interface devices. The sets of internal components 201 may include device drivers 240 to interface to a computer display monitor 260, keyboard 270, or computer mouse 280. The device drivers 240, R/W drive or interface 232, and network adapter or interface 236 may comprise hardware and software which is stored on ROM 224 or one or more storage devices 230.

Figure 3:
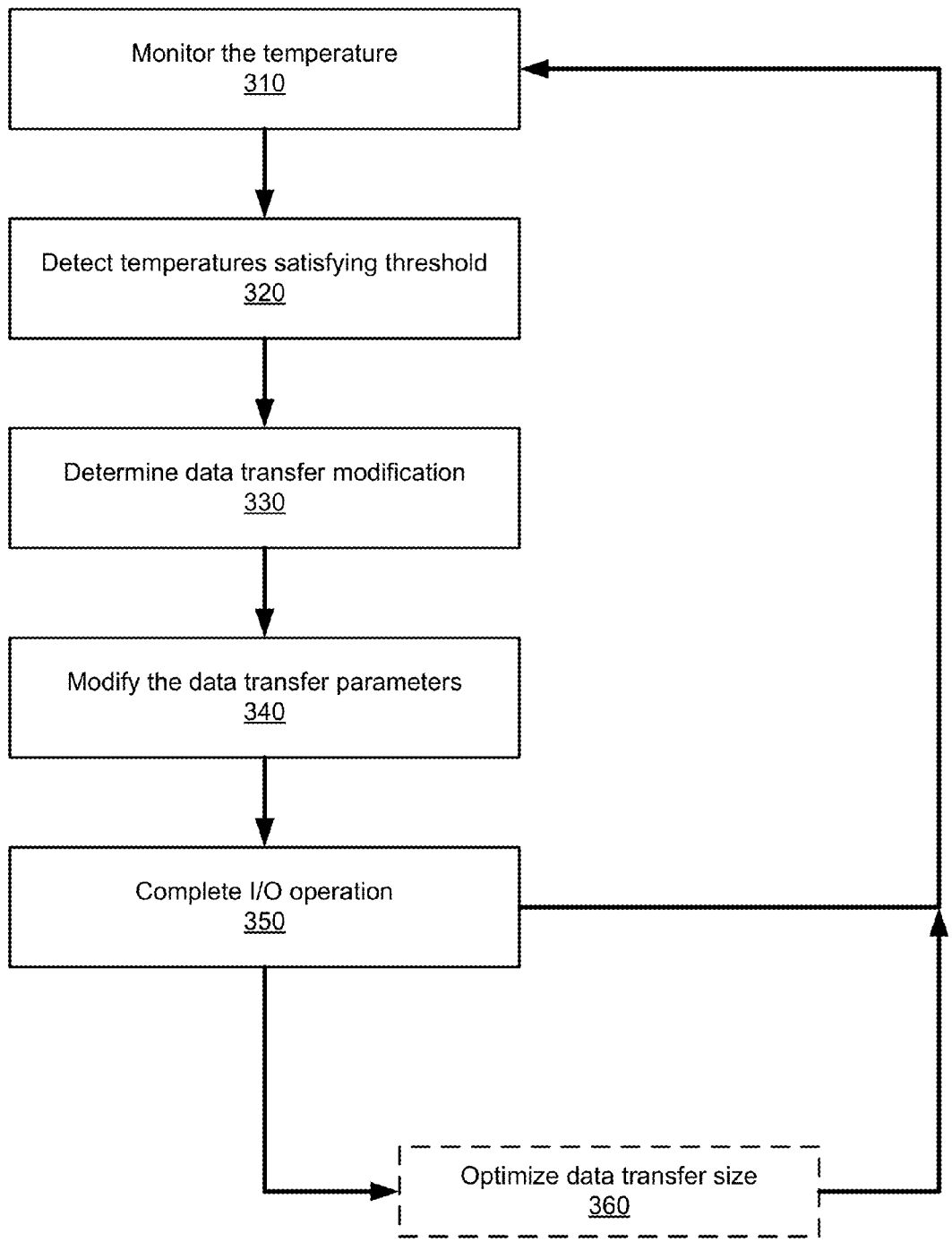
FIG. 3 is a method of managing temperature of a solid state drive device, according to embodiments.

FIG. 3 is a flowchart illustrating a method 300 for managing temperature of SSD devices. The temperature is managed by a controller. In some embodiments, the controller may be equivalent to the parameter determination engine 125 of FIG. 1. In other embodiments, the controller may be within the memory of the SSD Device (e.g., 130 of FIG. 1). The controller may intercept and manage one or more data transfer requests to the SSD. This may include determining data transfer parameters. Software of the controller may be installed using a standard operating system specific program (e.g., RPM for Linux). Following initialization, the controller may access the location where the operating system installed lookup tables and/or disk characterization data as described below. The visual arrangement of blocks in the flowchart of FIG. 3 is not to be construed as limiting the order in which the individual acts/operations may be performed, as certain embodiments may perform the operations of FIG. 3 in alternative orders. Blocks which are depicted with dashed lines are to be construed as optional operations.

At block 310 the temperature of the SSD is monitored. The controller may monitor the temperature. The controller may monitor the temperature using a sensor which gathers temperature readings (e.g., the sensor 155 from FIG. 1). Temperature as used herein may be the temperature of the SSD at a single physical point of the SSD gathered by a single sensor (e.g., the temperature of the cell which is being written to). Alternatively, temperature as used herein may be an amalgamation or calculation of temperatures at a plurality of physical points of the SSD gathered by one or more sensors. In some embodiments, the controller may receive temperature readings in time increments (e.g., a new reading every 30 seconds) for performance benefit reasons.

When the SSD is first initialized, the data transfer parameters may be unconstrained. Put differently, SSD device may perform I/O operations exactly as received from applications (e.g., application program 105 from FIG. 1), using the data transfer size of the request. In certain embodiments, the SSD may initially execute I/O operations writing randomly to cells (e.g., wear leveling) for life expectancy benefits.

At block 320 the temperature of the SSD satisfies a threshold (e.g., first threshold). The controller may be the operator which detects the threshold being satisfied. The threshold may be a temperature value at which the parameters of data transfer for the SSD should be modified. Threshold values may be preset/predetermined temperature values. For example, the SSD may have a temperature threshold of 38 degrees Celsius. The controller may detect that, due to a high volume of I/O activity on the SSD, the temperature may reached 38 degrees, satisfying the threshold.

In some embodiments, the SSD may have numerous thresholds (e.g. second threshold, third threshold, throttling threshold). The additional thresholds may signify rising temperatures at which the parameters should be more severely modified. For example, in response to a first level of I/O activity which brings the temperature to 38 degrees Celsius, a first response (e.g., first data transfer modification) may be appropriate. Likewise, a second, higher level of I/O activity which further raises the temperature to 42 degrees Celsius may satisfy a second threshold and warrant a more significant response (e.g., second data transfer modification).

At block 330 a data transfer modification is determined. The controller determines the data transfer modification. In some embodiments, a data transfer modification is a change to the procedure by which the computing system (e.g., 101 from FIG. 1) reads or writes data on the SSD device (e.g., 150 from FIG. 1). For example, in response to the computing system transmitting a write request to the SSD device, the controller may write to cells on the SSD in a random order (i.e., not writing to cells which are necessarily contiguous or logically arranged, but instead specifically writing to disparate cells throughout the SSD to diversity cell usage). Using this random data transfer parameter, if a controller received 5 write requests for a SSD which contained 1,000 available cells, the controller may send them to cells 87, 952, 356, 444, and 643. Alternatively, a controller may determine to switch the procedure/data transfer parameter from a random write method to a sequential write method. In the sequential data access method, write requests are executed in contiguous/clustered cells as possible. Using the example above, using a sequential writing method the controller may write the requests to cells 87, 88, 89, 90, and 91. As discussed herein, in certain embodiments the SSD device may default to writing data randomly.

For another example of a data transfer parameter, the controller may determine a change of the data transfer size. In some embodiments, the controller may restrict the amount of data which can be read from/written to the SSD in a single transfer, such that only a size data transfer size (e.g., 4 kB, 8 kB) is permissible. The amount of data may be measured in kilobytes, in kilobits, or in another known size unit, though the disclosure uses kilobytes for purposes of clarity and illustration. This disclosure is not to be interpreted as being limited to managing transfer size exclusively in kilobytes. When a large data read/write is required, it may be broken into numerous small data read/writes of the appropriate data transfer size. The controller may set the data transfer size for the SSD. In certain embodiments, the data transfer parameters may not set a transfer size restriction. In such embodiments, the controller may determine to modify the data transfer size (e.g., to 4 kB per data transfer or 8 kB per data transfer).

The controller may determine which data transfer parameter to modify by employing predetermined rules. For example, the controller may change the data transfer parameters from random to sequential writes in response to a predetermined rule which specifies that changing to sequential writes is the appropriate response to the first temperature threshold being satisfied. In other embodiments, the controller may determine the data transfer parameter to modify based on a lookup table which includes such values such as temperatures, settings for data transfer parameters, read volume (e.g., the number of read requests for the SSD during a given period of time), or write volume (e.g., the number of write requests for the SSD during a given period of time). The controller may use this lookup table to identify the data transfer parameter modification(s) (e.g., first data transfer modification) that meet this scenario. If the data transfer parameters found in the lookup table do not meet the current data transfer parameters (e.g., the data transfer parameters which were utilized by the SSD when the SSD satisfied the threshold do not match the values in the lookup table), the controller may determine to modify the parameters to the corresponding parameters of the lookup table.

In embodiments, if the data transfer parameters have already been modified by the controller once (e.g., have already been modified using the first/second data transfer modification), the controller may determine a further modification. In other embodiments, the determined modifications may include reverting back to previous/initial data transfer parameters.

At block 340 the data transfer parameters are modified. The parameters are modified using the modifications determined in block 330. The controller may modify the data transfer parameters. The data transfer parameters are modified in response to the temperature threshold being satisfied. For example, in block 310 the controller may monitor the temperature of the SSD modulating within 34 to 37 degrees Celsius over the course of an hour of activity. In response to a large spike in I/O activity, at block 320 the controller met detect the temperature of the SSD satisfying a temperature threshold of 38 degrees. The controller may check a lookup table and see that, at 38 degrees Celsius, the data transfer access mode should be sequential. Accordingly, the controller may modify the data transfer parameters to sequentially access the data of the SSD device. In embodiments, the controller will then manage the queue of data reads/writes to the SSD device so that the data is accessed sequentially.

At block 350 an I/O operation will complete. The I/O operation will consist of reading data on the SSD or writing data to the SSD. The I/O operation will be completed using the determined data transfer modifications from block 340. For example, if the controller determined the data transfer parameters included sequential data writes at block 340, at block 350 the I/O operation would access cells on the SSD sequentially per the data transfer parameters.

The controller may continue monitoring the temperature of the SSD as in block 310. In this way the controller may dynamically react to increasing or decreasing temperatures, adjusting the temperature as needed to manage the SSD. For example, after a few minutes of stable operation of the SSD at 38 degrees, a second spike of I/O activity further increases the temperature of the SSD to a second threshold at block 320 of 42 degrees Celsius. The controller may use preset rules to determine at block 330 that at 42 degrees the data transfer parameters include sequential data access and a data transfer size of 16 kBs. The controller may then modify at block 340 the data transfer size to 16 kBs, leaving the data transfer access method of sequential. Following this the controller may continue through with I/O operations. In certain embodiments, the controller may interrupt I/O operations to modify the data transfer parameters.

In some embodiments, the SSD may have throttling temperature thresholds at which the data transfer is throttled. A throttling threshold temperature may be a temperature at which continued performance may have extreme consequences for the SSD, in response to which data throttling may be necessary. For example, the controller may continue monitoring the temperature at block 310 and detect at block 320 that the temperature has reached a throttling temperature threshold of 44 degrees Celsius. In response to meeting the throttling threshold, the controller may determine at block 320 that the data transfer size should be dropped to 4 kBs using the sequential data access method. In addition to these two data transfer parameters, the controller may determine to throttle data transfer to only allow a certain number of data transmissions per minute (e.g., the controller will manually slow down the transfer of data to the SSD). After a short time throttling data, the controller may monitor the temperature and detect that the temperature has lowered and satisfied the previous threshold of 42 degrees as discussed herein. In response to this lowered temperature, the controller may determine to change parameters to the data transfer size of 16 kBs and using sequential data access as discussed above. In embodiments where the controller monitors the temperature at block 310 at set time intervals, the time intervals may become shorter during data throttling to expedite the data throttling (e.g., during data throttling, the controller will check temperature every second instead of every 30 seconds, so that data throttling may be interrupted as soon as the critical temperature is lowered).

At block 360 the controller may select a data transfer size based on expected I/O performance. The controller may select data transfer size by selecting one data transfer size of a group of data transfer sizes where all sizes within the group result in temperatures within a predetermined range of each other. For example, the SSD may have predetermined range of ±1 degree Celsius for which data transfer size will be optimized. In this example, if transfer sizes of 64 kB, 128 kB, and 256 kB all result in SSD temperatures which are within a single degree of an initial temperature (e.g., a temperature of the SSD before the transfer size was implemented), the controller may choose the transfer size which has the preferred performance. The preferred performance may be the performance which allows the most I/O operations in a given timeframe (e.g., the highest I/O Operations per Second (IOPS) or the highest Megabytes per Second (MBps)).

In some embodiments the controller may identify which data transfer sizes stay within a predetermined range of each other. The controller may identify these data transfer sizes through the process of modifying the data transfer size to said transfer sizes as per block 340 and, during the ensuing monitoring in block 310, determine that the temperature has not changed outside of the threshold. The controller may then record these data transfer sizes as data transfer sizes which may be used to increase IOPS or MBps.

For example, a controller may be managing temperature for a SSD device which has a temperature threshold of 40 degrees and a predetermined range of +1 degree Celsius. While monitoring the SSD, the controller may identify an average temperature of 40.61 degrees Celsius for the SSD while using sequential writes of transfer size 256 kB. Accordingly, the controller may change the transfer size to 128 kB, complete further I/O operations, and record an average temperature of 40.37 degrees Celsius. The controller may further modify the transfer size to 64 kB and identify a subsequent average temperature of 40.05. Finally, upon modifying the transfer size to 32 kB, the controller may identify a subsequent temperature of 39.24. Being as the transfer sizes of 256 kB, 128 kB, and 64 kB were all within the predetermined range of +1 degrees of 40 degrees, the controller may record these three transfer sizes as belonging to a subgroup of transfer sizes which may be used to increase IOPS or MBps. In subsequent attempts to manage temperature, the controller may choose one of these transfer sizes for performance reasons instead of temperature reasons, being as all transfer sizes within the subgroup result in a substantially similar resulting temperature. For example, the SSD may have higher IOPS at 256 kB transfer size than at 128 kB or 64 kB. In this example, if the controller is attempting to manage temperature by lowering the temperature from 43 degrees to 40 degrees, the controller may set the transfer size to 256 kB. If the controller wants to lower the temperature to below 40 degrees, the controller may use the record of the subgroup to change the transfer size straight from 256 kB to 32 kB, as both 128 kB and 64 kB offer substantially similar temperatures at lower performances. In other embodiments, a smaller or "middle" data transfer size within a subgroup may offer the higher IOPS or MBps values. Put differently, the preferred performance of SSD devices across a subgroup may not be a linear projection where the higher/lower transfer size reliable offers the best performance, but instead may be distinct to a specific model of a SSD.

Alternatively, the controller may use a lookup table to identify data transfer sizes to select from. The lookup table may be specific to a model of SSD which has predictable temperatures for set data transfer parameters. The SSD may be stress-tested with different transfer parameters and different I/O operation volumes with the resultant temperatures recorded. When the temperature reaches a relative plateau over a plurality of data transfer parameter settings, these data transfer parameter settings may be identified within the lookup table as part of an selectable subgroup. As such, when the controller selects a set of data transfer parameters which is identified within the lookup table as part of an selectable subgroup, the controller may elect the set of data transfer parameters of the subgroup which has the preferred performance.

In some embodiments, the controller may identify which sets of data transfer parameters have preferred performance. For example, after modifying the data transfer parameters at block 340 and completing I/O operations at block 350, at block 360 the controller may monitor and record how quickly the SSD completes I/O operations. Over the course of numerous I/O operations, the controller may identify a profile of how different transfer parameters correspond to SSD device performance. For example, after setting the SSD device to random writes using 32 kB transfer sizes writes, the controller may identify the SSD having an average performance measure of 4648 IOPS over the course of a few thousand I/O write operations. The controller may also identify the SSD as having an average performance measure of 9076 IOPS using 16 kB random writes. In this instance, if 16 kB and 32 kB resulted in SSD device temperatures within the predetermined range, the controller would select 16 kB to attain the higher IOPS.

In alternative embodiments, the controller may utilize an analytical lab characterization of the SSD to determine the performance metrics of the SSD. The lab characterization may be stored in a lookup table for the controller. The following paragraphs are a non-limiting example of how the analytical lab characterization may be established.

The SSD device may undergo analytical lab characterization using a variety of workloads to determine performance metrics of the SSD device. Performance metrics may be capabilities of the SSD device sufficient to quantify the SSD device. A predetermined workload may execute to determine and collect a plurality of performance metrics. The predetermined workload may be a task which will result in predictable and standard SSD device operations which can be used to quantify the capabilities of the SSD device. The predetermined workload may isolate the SSD device from the underlying computer platform, including other hardware or software components. In this way, the SSD device may be the only limiting variable in the test. The workload may consist of one or more industry-standard performance test suites (e.g., a latency test, a throughput test, or a write saturation test). In another embodiment, the workload may incorporate feedback data collected by the Transfer Size Determination and Optimization Engine (TSDOE) during customer operation (e.g., data collected by the TSDOE which signals that the observed performance metrics may not be comparable against the disk characterization data from a previous workload). In this way, disk characterization process may regularly improve the accuracy of the disk characterization data.

The following discussion of performance metrics is presented as an illustration of, and not a limitation on, possible data that a disk characterization workload may be designed to capture. One SSD performance metric may be latency, which represents an average time required to complete a predetermined profile of read commands, write commands, or a mixture of both. Latency may vary depending upon the size of the data (e.g., 4 kB or 256 kB) and the degree of randomness of the data access. The mixture of read commands versus write commands in a workload may likewise affect SSD latency.

Another possible performance metric may be data entropy, which may be described as the randomness exhibited by the data, itself, and may be further described in terms of compressibility of the data. Purely random data, such as video, may not be compressible because the randomness does not follow a probability distribution that compression algorithms may model. Similarly, data that is already compressed, as well as encrypted data, may have the redundancy patterns removed, rendering these data types incompressible. As such, the lower the entropy, the more redundant and compressible the data may be. Alternatively, the higher the entropy, the less redundant and compressible the data may be.

Another possible performance metric may be queue depth. Queue depth generally may be referred to as a number of I/O operations queued to a disk drive. Increasing queue depth may improve I/O throughput performance. Increasing queue depth may result in increasing latency, however.

Another possible performance metric may be write amplification, which is where the physical amount of data written exceeds the logical I/O request due to the architectural characteristics of SSD technology. Generally, the flash storage component of a SSD is constructed in pages (e.g., each page being 8 kB of data) that are organized in blocks (e.g., each block being 256 kB of data). In SSD technology, data is not directly overwritten, but is marked for later deletion. This operation of marking for later deletion occurs at the block level. Therefore, over time, data in a file may become increasingly fragmented and spread over several blocks. To support the I/O profile of an application, it may be necessary to relocate data within the blocks. Relocating data within the blocks includes mapping and updating the location of the data within the blocks and erasing the affected blocks. In this way, an I/O request to write 4 kB of data may result in movement of up to an entire 256 kB block, which in turn may result in a write amplification factor of 64 to 1 (e.g., 256 kB/4 kB).

A transfer size for a test sequence may be selected. The transfer size may be the capacity, in kilobytes, of the data which will be transmitted/written to the SSD. While limiting transfer size, the SSD device may be purged and preconditioned prior to beginning a test sequence of a given selected transfer size (e.g., 4 kB). Initially, a new and previously unused SSD device may exhibit a period of elevated performance because the blocks of the SSD device are equally available and random updates and deletions have not yet contributed to fragmentation. As such, a purge process may return the SSD device to its original state following the completion of a test sequence, effectively erasing the existing data. During preconditioning, a prescribed workload may be executed on the SSD device to set any prerequisite conditions for the next test sequence.

The data access attribute (e.g., sequential or random) may be selected for a particular test sequence. The test sequence may iterate for a plurality of parameters (e.g., entropy, read/write percentage, queue depth, or compressibility of the data). As the iterations of the test over the plurality of parameters are completed for the given transfer size, a table of results representing performance (e.g., IOPS, MBps) may be created for different parameters (e.g., transfer size, data access attributes, plurality of parameters) input to the disk characterization process. The sequence may repeat for different transfer size.

Following the completion of the test sequences for each of the transfer sizes the resulting performance metrics of the SSD device may be aggregated as disk characterization data. For example, the disk characterization data may be for a 200 Gigabyte (GB) SSD device. For this SSD device, the input test parameters may include a 50% ratio of read to write operations, a queue depth of "32" pending I/O operations, and a variety of entropies for each of a range of transfer sizes. The IOPSs and/or MBps in the disk characterization data may represent the calculated throughput values for the various combinations of parameters and transfer sizes that were tested. The disk characterization data may be supplied on the SSD device as firmware (e.g., firmware 130 from FIG. 1), or as separate software that may be installed by the operating system. In another embodiment, the disk characterization method may constitute a part of a vendor's ongoing product maintenance schedule. Product maintenance that includes disk characterization data may be supplied as updates to the firmware, the device driver, or the operating system. As part of applying the product maintenance, the operating system may dynamically update its existing copy of the disk characterization data, thereby keeping a SDD device that is in service on a computer current.

As part of configuring the SSD device for use by the computer, the controller may add the disk characterization data to the computer when the SSD device is installed. The controller may also add any other lookup table discussed herein when configuring the SSD device for use by the computer. In general, when a device is initially connected to a computer, the operating system uses specialized program instructions to add the device to a table of devices known to the operating system. In operation, when the SSD device is first connected to the computer, the SSD device reports its identifying characteristics (e.g., device type, vendor identifier, product identifier, serial number, capacity (i.e., in GB of data), associated device driver software, or a list of commands or other functions known to the device). The operating system may invoke a platform-specific configuration method to generate a unique device identifier for the SSD device, therein building an entry for the SSD device in the operating system device table which may reside in, for example, storage medium or operating system memory. As part of the device configuration process, the operating system may install the disk characterization data associated with the SSD device to a location accessible to the TSDOE. The disk characterization data entries for all the SSD devices may be organized for efficient access as a database, an array, a linked list, or in another format suitable for storing similar types of data. In this way the TSDOE may process simultaneous data transfer requests for SSD devices.

In addition to a predetermined workload, the disk characterization process described above may incorporate feedback data that the TSDOE may collect during customer operation, such as when the TSDOE determines that the observed performance metrics are not comparable against the disk characterization data produced from the previous workload. This may occur, for example, when no disk characterization data was supplied with an installed SSD device, or when a lack of granularity in the disk characterization data resulted in the TSDOE choosing default values. In some embodiments, vendors may supply updated disk characterization data throughout the lifecycle of the SSD device. An administrator of the computer system may install these updates using a platform-specific procedure similar to that used when adding maintenance to an operating system. Upon installation, the operating system may dynamically update its existing copy of disk characterization data, making the updated version promptly available to the TSDOE. Thus, the TSDOE and the computer can transparently respond to the latest nuances and features of the SSD device with improved transfer size granularity.

The TSDOE may be a subcontroller within the controller, and as such may intercept and manipulate one or more data transfer requests to the SSD device when the resulting temperatures will be within a predetermined range. This may include determining a data transfer size for improved performance. The TSDOE software may be installed using a standard operating system specific program (e.g., RPM for Linux). Following initialization, the TSDOE may access the location where the operating system installed the disk characterization data during the device configuration process of as described above and then begins operation.

The TSDOE may intercept and parse data transfer requests which originated in various layers in the software stack and identified a SSD device as a target. For example, a user application program may request to read a 4 B block of data by specifying the name of the file where the data is stored. The operating system may associate the file name and the data transfer request with the SSD device, after which the operating system may package the data transfer request and its associated parameters (e.g., random or sequential, amount of data to transfer, number of threads processing the data, compressibility of the data) into a structure (e.g., a control block). A next layer (e.g., the kernel) may receive the control block and add to or modify the parameters.

Before reaching the device driver for the SSD device, the TSDOE may intercept the control block and extract parameters that uniquely identify the SSD device (e.g., operating system-generated device identifier, vendor identifier, product identifier, serial number) to search the disk characterization data entries for an entry associated with the SSD device. If no matching entry is found (e.g., where the disk characterization data is corrupted, or where no disk characterization data was provided for the SSD device) then the TSDOE may pass the data transfer request (i.e., default parameters) unchanged to the device driver for the SSD device for completion.

When a disk characterization data entry corresponding to the SSD device is found, the TSDOE may parse the contents of the control block for parameters describing the data transfer request, such as a transfer size and whether the request is to read or write. The TSDOE may determine an optimized transfer size based on the extracted data transfer parameters and/or the disk characterization data. For example, the TSDOE may parse the control block and determine that data is to be read from a 200G SSD device having the disk characterization data described above. Based on this disk characterization data, the TSDOE may determine that an 8 kB transfer size is likely to provide an optimized throughput in terms of IOPS and MBps in comparison to the 4 kB transfer size originally requested by an application program. The TSDOE may modify the data transfer request to use the new data transfer value (e.g., 8 kB) and pass the modified data transfer request (e.g., 8 kB) to the device driver for the SSD device for completion.

However, if an optimized transfer size cannot be determined from the data transfer parameters, such as when one or more parameters is missing from the data transfer request, the TSDOE may attempt to intelligently substitute a value for the missing parameter based on the available data transfer parameters. Where no substitution is feasible, the TSDOE may pass the data transfer request unchanged to the device driver for the SSD device for completion.

Figure 4A:
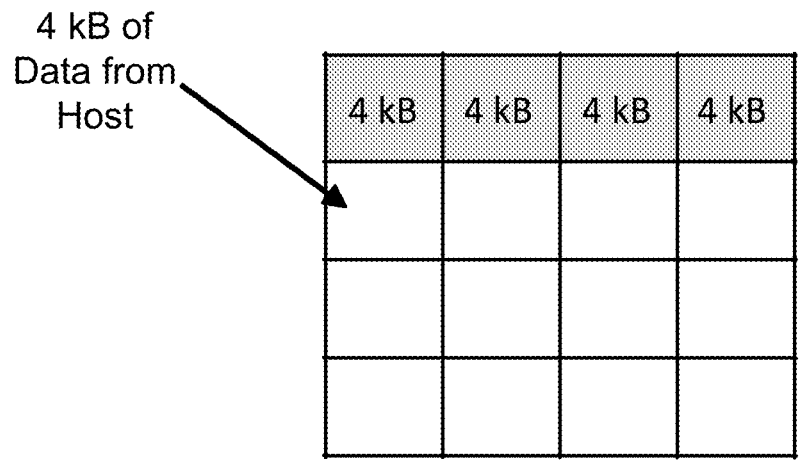
FIG. 4A is a depiction of a sequential write to a solid state drive device, according to embodiments.
Figure 4B:
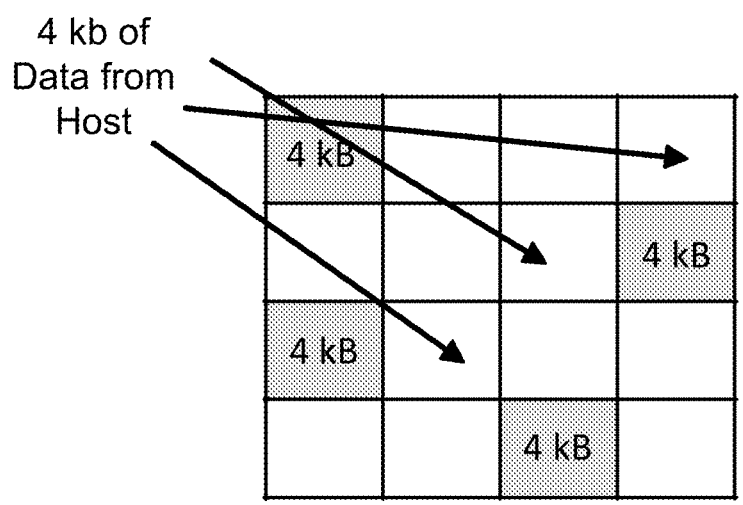
FIG. 4B is a depiction of a random write to a solid state drive device, according to embodiments.

FIG. 4A depicts an example of a sequential write operation. In FIG. 4A, the controller has written to four cells in a row using 4 kB transfer size. As a new 4 kB write is received, the controller sends the new write to the next cell in sequential order. FIG. 4B depicts an example of a random write operation. In FIG. 4B, the controller has written 4 kB writes to four random cells which are discontiguous from each other. However, is it to be understood that random write operations do not require that subsequent writes are to be discontiguous cells. As more 4 kB writes are received, the controller continues sending the writes to disparate portions of the SSD.

FIG. 5 depicts an example of a lookup table which can be used during method 300 to manage temperature. The lookup table shows numerous configurations using different sets of data transfer parameters, from random writes of 4 kB (e.g., Rand_write_4k) to sequential writes of 256 kB (e.g., Seq_write_256k). The controller can use this lookup table to select parameters based upon temperatures and the write amplification as described herein. In embodiments, the lookup table of FIG. 5 may be the lookup table for data transfer subgroups which result in the same temperature as described in the discussion of block 360 of FIG. 3.

The functionality outlined in the discussions herein above can be implemented using program instructions executed by a processing unit, as described in more detail below.

The flowchart and block diagrams in FIGS. 1-3 illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A computer system for managing temperature of a solid state disk (SSD) device comprising:
   a memory; and
   one or more processing circuits communicatively coupled to the memory, wherein the one or more processing circuits are configured to:
     monitor, using temperature readings from a temperature sensor, the temperature of the SSD device over time, wherein the SSD device has a set of data transfer parameters;
     detect the temperature satisfying a first threshold;
     determine a first data transfer modification which is configured to modify a first data transfer parameter of the set of data transfer parameters;
     modify, in response to the temperature satisfying the first threshold, the first data transfer parameter with the first data transfer modification; and
     complete one or more Input/Output (I/O) operations with the SSD device using the modified first data transfer parameter, wherein the first data transfer modification is configured to switch a method of writing data to the SSD device between writing to random cells of the SSD device and writing to sequential cells of the SSD device.

2. The computer system of claim 1, wherein the first data transfer modification is configured to modify a permissible size of data transfer packets for the SSD device.

3. The computer system of claim 1, wherein the one or more processing circuits are further configured to:
   detect the temperature satisfying a second threshold;
   determine a second data transfer modification which is configured to modify of a second data transfer parameter of the set of data transfer parameters;
   modify, in response to the temperature satisfying the second threshold, the second data transfer parameter with the second data transfer modification; and
   complete one or more I/O operations with the SSD device using the modified second data transfer parameter.

4. The computer system of claim 1, wherein the one or more processing circuits are further configured to:
   detect the temperature satisfying a throttling threshold; and
   throttle data transfer to the SSD device in response to the temperature satisfying the throttling threshold.

5. The computer system of claim 1, wherein the one or more processing circuits are further configured to:
   determine a plurality of permissible sizes of data transfer packets which result in a set of resulting temperatures which are within a predetermined range of each other;
   identify a permissible size of data transfer packets of the plurality of permissible sizes of data transfer packets which is capable of increased I/O performance relative to other permissible sizes of data transfer packets of the plurality of permissible sizes of data transfer packets;
   modify, in response to the temperature satisfying the first threshold, the set of data transfer parameters to use the permissible size of data transfer packets; and
   complete one or more I/O operations with the SSD device using the modified set of data transfer parameters.

6. A computer program product for managing temperature of a solid state disk (SSD) device, the computer program product disposed upon a computer readable storage medium, the computer program product comprising computer program instructions that, when executed by a computer processor of a computer, cause the computer to:
   monitor, using temperature readings from a temperature sensor, the temperature of the SSD device over time, wherein the SSD device has a set of data transfer parameters;
   detect the temperature satisfying a first threshold;
   determine a first data transfer modification which is configured to modify a first data transfer parameter of the set of data transfer parameters;
   modify, in response to the temperature satisfying the first threshold, the first data transfer parameter with the first data transfer modification; and
   complete one or more Input/Output (I/O) operations with the SSD device using the modified first data transfer parameter, wherein the first data transfer modification is configured to switch a method of writing data to the SSD device between writing to random cells of the SSD device and writing to sequential cells of the SSD device.

7. The computer program product of claim 6, wherein the first data transfer modification is configured to modify a permissible size of data transfer packets for the SSD device.

8. The computer program product of claim 6, the computer program product further comprising instructions which, when executed by the computer processor, cause the computer to:
   detect the temperature satisfying a second threshold;
   determine a second data transfer modification which is configured to modify of a second data transfer parameter of the set of data transfer parameters;
   modify, in response to the temperature satisfying the second threshold, the second data transfer parameter with the second data transfer modification; and
   complete one or more I/O operations with the SSD device using the modified second data transfer parameter.

9. The computer program product of claim 6, the computer program product further comprising instructions which, when executed by the computer processor, cause the computer to:
   detect the temperature satisfying a throttling threshold; and
   throttle data transfer to the SSD device in response to the temperature satisfying the throttling threshold.

10. The computer program product of claim 6, the computer program product further comprising instructions which, when executed by the computer processor, cause the computer to:
- determine a plurality of permissible sizes of data transfer packets which result in a set of resulting temperatures which are within a predetermined range of each other;
- identify a permissible size of data transfer packets of the plurality of permissible sizes of data transfer packets which is capable of increased I/O performance relative to other permissible sizes of data transfer packets of the plurality of permissible sizes of data transfer packets;
- modify, in response to the temperature satisfying the first threshold, the set of data transfer parameters to use the permissible size of data transfer packets; and
- complete one or more I/O operations with the SSD device using the modified set of data transfer parameters.

* * * * *